United States Patent
Shrivastava

(10) Patent No.: US 8,762,907 B2
(45) Date of Patent: Jun. 24, 2014

(54) HIERARCHICAL EQUIVALENCE CHECKING AND EFFICIENT HANDLING OF EQUIVALENCE CHECKS WHEN ENGINEERING CHANGE ORDERS ARE IN AN UNSHARABLE REGISTER TRANSFER LEVEL

(71) Applicant: LSI Corporation, Milpitas, CA (US)

(72) Inventor: Arvind Shrivastava, Maharashtra (IN)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 13/669,737

(22) Filed: Nov. 6, 2012

(65) Prior Publication Data

US 2014/0129998 A1    May 8, 2014

(51) Int. Cl.
  *G06F 17/50* (2006.01)
(52) U.S. Cl.
  USPC .......................................... 716/107; 716/106
(58) Field of Classification Search
  USPC ................................................ 716/106–108
  See application file for complete search history.

(56) References Cited

U.S. PATENT DOCUMENTS

| | | | |
|---|---|---|---|
| 6,530,073 B2 | 3/2003 | Morgan | |
| 2002/0162086 A1* | 10/2002 | Morgan | 716/18 |
| 2007/0271537 A1* | 11/2007 | Budumuru | 716/5 |

* cited by examiner

*Primary Examiner* — Binh Tat

(57) ABSTRACT

An apparatus, a hierarchical method of equivalence checking a circuit design and equivalency checking after engineering change orders in a circuit design are disclosed herein. In one embodiment, a method of equivalence checking includes: (1) receiving a post-engineering change order (ECO) netlist of a first one of the functional blocks, wherein the post-ECO netlist has been verified employing an equivalence checker, (2) generating a top level netlist for the circuit design including the post-ECO netlist and a block netlist for a second one of the multiple functional blocks, (3) generating a top level register transfer level (RTL) for the circuit design including a RTL for the second functional block and (4) performing an equivalency check of the top level RTL to the top level netlist, wherein a RTL for the first functional block and the post-ECO netlist are black boxed for the performing.

20 Claims, 2 Drawing Sheets

HIERARCHICAL EQUIVALENCE CHECKING AND EFFICIENT HANDLING OF EQUIVALENCE CHECKS WHEN ENGINEERING CHANGE ORDERS ARE IN AN UNSHARABLE REGISTER TRANSFER LEVEL

TECHNICAL FIELD

This disclosure relates to, in general, designing circuits and, more specifically, to performing equivalence checks for circuit designs.

BACKGROUND

Circuit designers use electronic design automation (EDA) tools, a category of computer aided design (CAD) tools, to create a functional circuit design, including a register transfer level (RTL) representation of the functional circuit design, synthesize a "netlist" from the RTL representation, and implement a layout from the netlists. Synthesis of the netlist and implementation of the layout involve simulating the operation of the circuit and determining where cells should be placed and where interconnects that couple the cells together should be routed. EDA tools allow designers to construct a circuit, simulate its performance, estimate its power consumption and area and predict its yield using a computer and without requiring the costly and lengthy process of fabrication.

One such EDA tool performs equivalence checking. Equivalence checking is a part of the EDA process typically used during the development of circuits to formally prove that two representations of a circuit design exhibit exactly the same behavior. One form of equivalence checking is comparing an RTL of a circuit design to a netlist developed from the RTL.

SUMMARY

In one aspect, a method of equivalence checking a top level of a circuit design having multiple functional blocks is disclosed. In one embodiment, the method includes: (1) receiving a post-engineering change order (ECO) netlist of a first one of the functional blocks, wherein the post-ECO netlist has been verified employing an equivalence checker, (2) generating a top level netlist for the circuit design including the post-ECO netlist and a block netlist for a second one of the multiple functional blocks, (3) generating a top level register transfer level (RTL) for the circuit design including a RTL for the second functional block and (4) performing an equivalency check of the top level RTL to the top level netlist, wherein a RTL for the first functional block and the post-ECO netlist are black boxed for the performing.

In another aspect, a non-transitory computer-readable medium having stored thereon instructions that, when executed, implement a method of performing an equivalency check of a top level of a circuit design. In one embodiment, this implemented method includes: (1) receiving a post-engineering change order (ECO) netlist of a first functional block of the circuit design, wherein the post-ECO netlist has been verified employing an equivalence checker and (2) performing an equivalency check of a top level register transfer level (RTL) of the circuit design to a top level netlist of the circuit design, the top level RTL including a RTL of a second functional block of the circuit design and the top level netlist including a netlist of the second functional block, wherein a first functional block RTL and the post-ECO netlist are black boxed for the performing.

In yet another aspect, an apparatus is disclosed. In one embodiment, the apparatus includes: (1) circuitry for receiving a post-engineering change order (ECO) netlist of a first functional block of a circuit design, wherein the post-ECO netlist has been verified employing an equivalence checker and (2) circuitry for performing an equivalency check of a top level register transfer level (RTL) of the circuit design to a top level netlist of the circuit design, the top level RTL including a first black box for a RTL of the first functional block and a RTL of a second functional block of the circuit design, the top level netlist including a second black box for the post-ECO netlist and a netlist of the second functional block.

In still another aspect a hierarchical equivalence checking method for a top level of a circuit design having multiple functional blocks is disclosed. In one embodiment the hierarchical equivalence checking method includes: (1) executing an equivalency check on a portion of one of the multiple functional blocks to generate a pre-verified portion of the one of the multiple functional blocks and (2) subsequent to the executing, performing a top level equivalency check of the circuit design, wherein the pre-verified portion of the functional block is black boxed for the top level equivalency check.

BRIEF DESCRIPTION OF THE DRAWINGS

For a more complete understanding of the disclosure, reference is now made to the following descriptions taken in conjunction with the accompanying drawings, in which.

DETAILED DESCRIPTION

Figure 1:
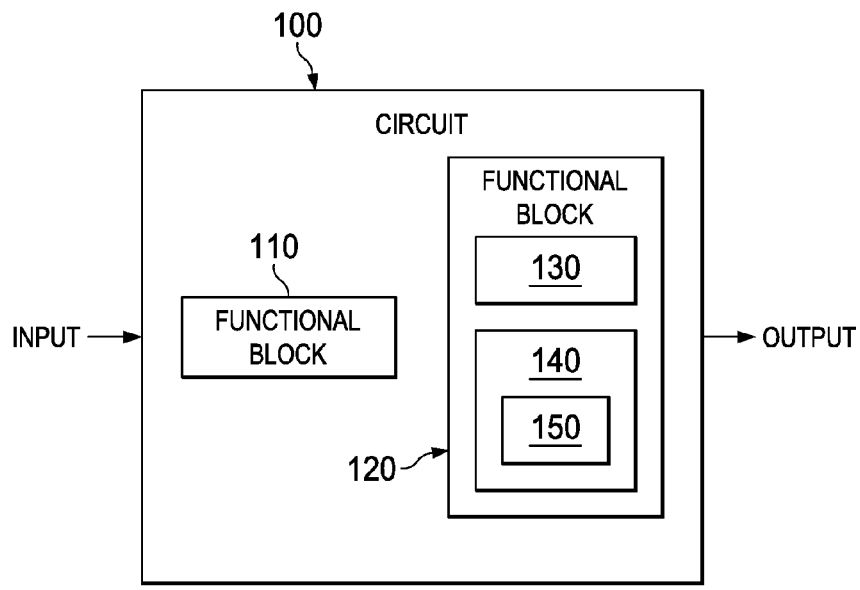
FIG. 1 illustrates a block diagram of an embodiment of a circuit constructed according to the principles of the disclosure.

Some circuits include multiple modules or functional logic blocks that cooperate to provide a system, such as a system on a chip (SOC). In a hierarchical model of the circuit, the top most level is referred to as the top level and the lower levels of the circuit are referred to as the block levels. A circuit design can be co-developed between a customer and a vendor wherein the customer has a functional logic block that is included in the circuit design.

An equivalence check is often performed for the top level of a circuit design to confirm that the circuit functionality is intact post synthesis. An EDA tool is typically used to perform equivalence checks. An equivalence mapping tool works on key points in the circuit design when comparing the two circuit design representations, a RTL and a netlist. A key point of a circuit design is a comparison node for an equivalence checking tool. Key points include but are not limited to primary inputs (PI), primary outputs (PO), and data input and output of sequential cells. An equivalence check tool verifies the mapped key points for equivalence. If there are no failures, then the netlist is equivalent to the RTL and the circuit design can proceed to tape out.

In co-developed circuit designs, a top level equivalency check can be difficult since the RTL for the customer's functional logic block is owned by the customer and is not shared with the vendor due to proprietary issues. Thus, the customer delivers a synthesized version of the functional logic block, a netlist, without delivering the RTL for the functional logic block.

In such situations, the top level RTL can be co-developed by the customer and the vendor. Accordingly, both the customer and vendor have access to the top level RTL and can functionally verify the top level RTL. The customer can functionally verify the top level RTL by using dynamic simulations. Dynamic simulation is a method of verifying functionality of a circuit under design by applying stimulus and verifying that the output of the circuit is the same as functionally expected. As such, the top level RTL is considered "golden," i.e., verified correct by using functional test vectors.

The vendor can synthesize the functional blocks in which an RTL is provided and generate a netlist therefor. Additionally, the vendor can synthesize the top level RTL of a circuit, using netlist provided from the customer and the generated netlist of his functional blocks during synthesis, to produce a top level netlist. The customer netlist is considered "don't touch" and is not modified during this process. An equivalence check is then done with the top level RTL versus the top level netlist to make sure circuit functionality is intact post synthesis.

Engineering change orders (ECO) often occur during the design process of a circuit. When this occurs in a customer block, the RTL for the block has to be updated and verified by the customer. Additionally, the ECO RTL has to be applied in the layout of the circuit. Typically, there are two methods for applying the ECO RTL to the circuit layout. In the first method, the ECO RTL is synthesized and the DFT and layout are redone. In the second method, the netlist for the existing circuit layout is manually updated or updated by using EDA tools. Usually option 2 is employed because it requires less time to implement the ECO in the layout. However after an ECO occurs and applied in the layout, performing a top level equivalency check (RTL to layout) of the circuit in the absence of a RTL of a portion of the circuit, such as a customer RTL, is difficult.

The disclosure provides a method and apparatus for processing an equivalence check when ECOs are in a RTL that is not shared. The disclosure supports efficient handling of verification of ECO performed on a customer's logic when a RTL is not available for comparison through equivalence checking. The disclosure is also applicable for successive "black boxing" when performing equivalence checking in design scenarios when a complete top level (such as a system on a chip (SoC)) RTL is available to a vendor; this is especially advantageous when the design size is large. A "large design" is a circuit design requiring a significant amount of run time or processing resources to perform an equivalency check. Typically, circuit designs greater than ten million gates can have processing resource issues because of the large number of key points. As such, a hierarchical equivalence check can be used wherein a lower hierarchical level of a functional block of a circuit design is compared first (e.g., R2 compared to G2) and then an equivalency check at a higher hierarchical level, such as a top level, is performed. When the top level equivalency check is performed, the pre-verified portion of the circuit design (R2 and G2) can be black boxed. Thus, equivalence checking with black boxing can be used to improve run time and reduce resource foot print. Black boxing or black boxed refers to analyzing a functional block as a whole without examining the internal circuitry thereof. Thus, instead of considering the internal circuitry of a functional block, the inputs and outputs for the functional block can be considered.

FIG. 1 illustrates a block diagram of an embodiment of a circuit 100 constructed according to the principles of the disclosure. The circuit 100 is configured to receive an input (at least one input), perform a function (at least one function) and generate at least one output. The circuit 100 includes functional logic blocks 110 and 120 that are configured to receive the input, perform a function and generate the output. One skilled in the art will understand that the circuit 100 can include additional functional logic blocks or components than those illustrated in FIG. 1.

The circuit 100 is an integrated circuit. The circuit 100 can be, for example, a SoC circuit and the functional blocks 110, 120 can be customer logic and vendor logic, respectively.

The circuit 100 is co-developed by a vendor and at least one customer. The functional logic block 110 is a proprietary functional block. As such, the RTL of the functional logic block is proprietary and unavailable to the vendor. In this embodiment, functional logic block 110 is from a customer of the vendor. Instead of providing the RTL of the functional logic block 110 to the vendor who is constructing the circuit 100, the customer provides a synthesized version of the RTL, e.g. a netlist, to the vendor during the design process of the circuit 100. The functional logic block 120 is from the vendor and the RTL for this functional logic block is available to the vendor during the design process of the circuit 100. In some embodiments, the circuit 100 includes additional functional logic blocks including multiple proprietary functional logic blocks. In one embodiment, different customers provide the various proprietary functional logic blocks.

Functional logic block 120 includes various portions or functional logic blocks that are denoted as logic blocks 130, 140 and 150, wherein logic block 150 is within logic block 140. The logic blocks 130, 140, 150, represent logic levels or a hierarchy within the functional logic block 120. As such, each of the logic blocks 130, 140, 150, include circuitry configured to implement the particular functions of each of the logic blocks 130, 140, 150. For example, functional logic block 120 includes twenty million gates that includes ten million logic gates from logic block 130 and ten million logic gates from logic block 140, which includes five million logic gates from logic block 150. To reduce run time and processing resources, in one embodiment the disclosure advantageously employs the hierarchies of a circuit for equivalency checking by performing hierarchical equivalency checking. As such, before performing a top level equivalency check even when a complete RTL for the circuit 100 is available, an equivalency check can be performed on lower logic levels of the circuit 100 for pre-verification. Additional equivalency checks are then performed on higher logic levels of the circuit 100 wherein pre-verified equivalency checked blocks are black boxed.

Figure 2:
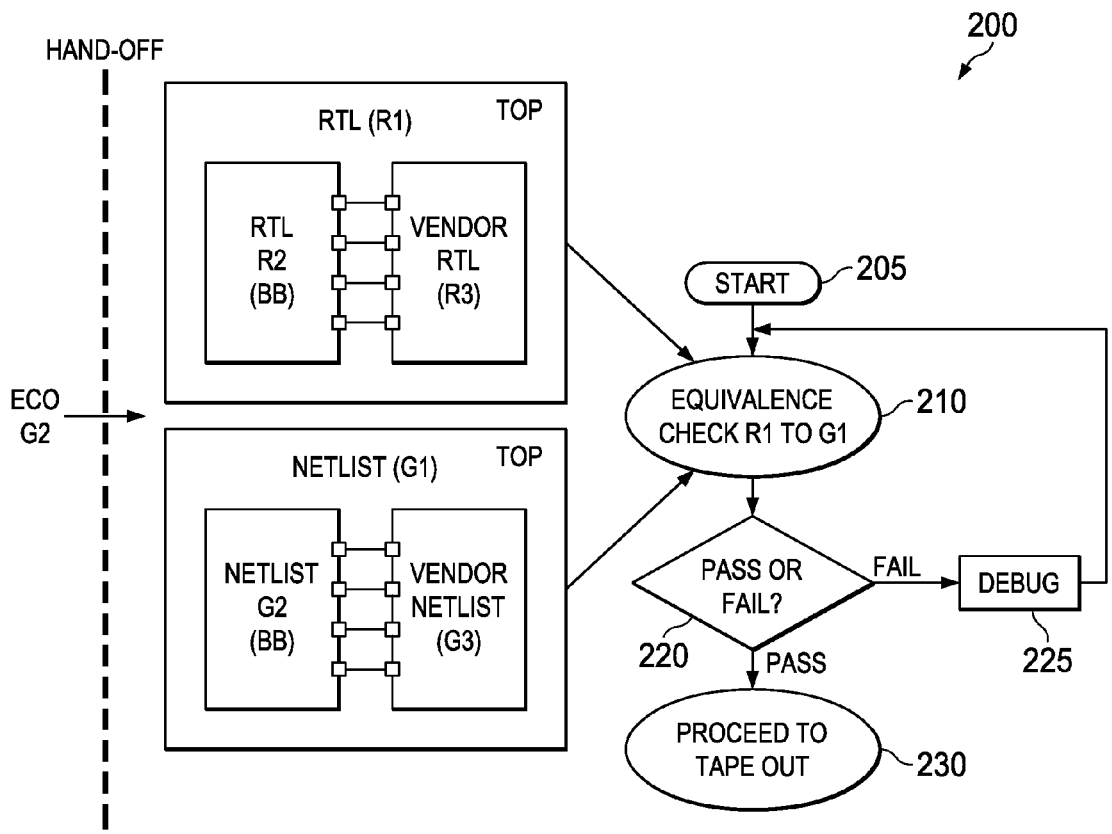
FIG. 2 illustrates a flow diagram of an embodiment of a method 200 for designing a circuit including equivalence checking carried out according to the principles of the disclosure.

Thus, considering the functional logic block 120 of FIG. 1, in one embodiment an equivalence check is performed on logic block 150 to pre-verify that block. Next, equivalence checks are performed on logic block 130 and 140 wherein logic block 150 is black boxed for the equivalence check of block 140. Thereafter, an equivalence check is performed on block 120 wherein the pre-verified blocks 130 and 140 are black boxed. A top level equivalence check of the circuit 100 can then be performed without considering the pre-verified functional logic block 120 and each of its component logic blocks 130, 140 and 150 that have been pre-verified. As such, successive equivalence checking with black boxing of pre-verified blocks can be advantageously employed even when a top level RTL for a circuit is known. FIG. 2 addresses when a RTL for a portion of a circuit, such as functional logic block 110, is not known to a vendor.

FIG. 2 illustrates a flow diagram of an embodiment of a method 200 for designing a circuit including performing equivalence checking carried out according to the principles of the disclosure. The method 200 includes performing functional equivalence checking at the top level of a circuit design that includes at least one proprietary functional logic block. Thus, the RTL for the proprietary functional logic block is not available for top level equivalence checking. In FIG. 2, the circuit 100 of FIG. 1 will be used to illustrate the method 200. As noted above, the circuit 100 includes a single proprietary functional logic block 110 and an additional functional logic block 120. One skilled in the art will understand that the method 200 can also be employed to perform top level equivalence checking for a circuit design that has multiple proprietary functional logic blocks. As such, processing of the functional logic block 110 as illustrated in FIG. 2 represents similar processing for other proprietary functional logic blocks that are from the same customer or even from another customer.

A test apparatus may include the necessary logic circuitry to carry out the method 200 or at least a portion thereof. In one embodiment, the method 200 may be embodied as a series of operating instructions that are stored on a non-transitory computer readable medium and used to direct the operation of a processor when initiated thereby. In some embodiments, each step of the method 200 may be accomplished by employing an EDA tool or a plurality of EDA tools. As such, different EDA tools may be used for each step of the method 200 or for at least two different steps of the method 200. Some of the EDA tools may be commercially available tools that are commonly used for IC design and have been modified to perform functions disclosed herein. In some embodiments, proprietary EDA tools may be used. The method 200 begins in a step 205.

In a step 210, an equivalence check is performed at the top level of the circuit design 100. The equivalence check is performed by comparing an RTL of the top level of the circuit 100 (referred to herein as RTL R1) with a netlist of the top level of the circuit (referred to herein as netlist G1) and determining equivalency of RTL R1 to the synthesis version thereof, netlist G1. In some embodiments, an equivalence checking tool is employed to perform step 210. In one embodiment a conventional equivalence checking tool is used.

Unlike traditional functional equivalence checking, all of the netlist G1 key points can not be mapped to all of the RTL R1 key points since the RTL for proprietary functional block 110 (herein referred to as RTL R2) is not available. As such, the RTL for the proprietary functional block 110 (referred to herein as RTL R2) and the netlist for the proprietary functional block 110 (referred to herein as netlist G2) are black boxed during the equivalence checking (represented by BB in FIG. 2). Accordingly, the disclosure advantageously employs a black box for equivalence checking when the RTL is not available.

Since RTL R2 and netlist G2 are black boxed, the equivalence check in step 210 can be performed by comparing RTL R1 to netlist G1. The netlist G1 can be a synthesized netlist, a DFT netlist or a layout netlist. In some embodiments, each of the netlists used for equivalence checking can be a synthesized netlist, a DFT netlist or a layout netlist. The netlist G3 can be generated in a conventional manner from RTL R3.

Netlist G2 is pre-verified by the customer using an equivalence checker. The netlist G2 can be a synthesized netlist or a post-ECO netlist. The post ECO netlist can be provided by a method 300 illustrated in FIG. 3. A dashed line separates the methods 200, 300, and indicates the handoff of a post-ECO netlist G2 from the method 300 to the method 200. Method 300 will be discussed in more detail below.

Returning now to method 200, after an equivalence check is performed in step 210, a determination is made in decisional step 220 if the equivalence check passed or failed. If passed, the method 200 proceeds to tape out in step 230 and ends. If the equivalence check failed, the method 200 continues to step 225 for debugging. After debugging, the method continues to step 210 for additional equivalence checking. Debugging and determining passing or failing of the equivalence checking can be performed conventionally with consideration to the black boxed RTL R2 and netlist G2. In one embodiment, steps 220 and 225 are performed via conventional methods.

Figure 3:
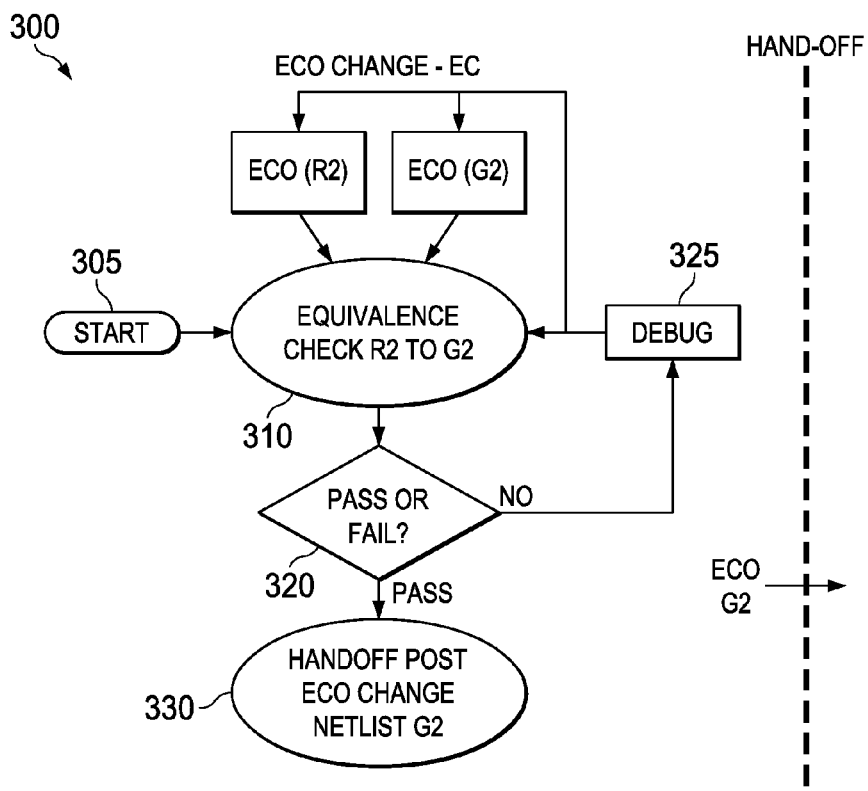
FIG. 3 illustrates a flow diagram of an embodiment of a method of generating a post ECO netlist of a proprietary functional block of a circuit carried out according to the principles of the disclosure.

Turning now to FIG. 3, illustrated is a flow diagram of an embodiment of a method 300 of generating a post ECO netlist of a proprietary functional block of a circuit carried out according to the principles of the disclosure. In FIG. 3, the proprietary functional block is the proprietary functional block 110 of FIG. 1. The method 300 begins in a step 305.

In step 310 an equivalence check is performed for the proprietary functional block 110. The equivalence check can be performed by a conventional equivalence check tool. The equivalence check is between a post ECO RTL of the proprietary functional block 110 (herein referred to as ECO R2) and a post ECO netlist of the proprietary functional block (herein referred to as ECO G2). The ECO R2 and the ECO G2 are generated by the customer and can be generated by conventional means.

After an equivalence check is performed in step 310, a determination is made in decisional step 320 if the equivalence check passed or failed. If passed, the method 300 proceeds to step 330 where the ECO G2 is provided to the netlist G1 in FIG. 2. If the equivalence check failed, the method 300 continues to step 325 for debugging. After debugging, the method continues to step 310 for additional equivalence checking. Additionally, ECO R2 and ECO G2 are updated during the debugging process. Debugging and determining passing or failing of the equivalence checking can be performed conventionally.

Figure 4:
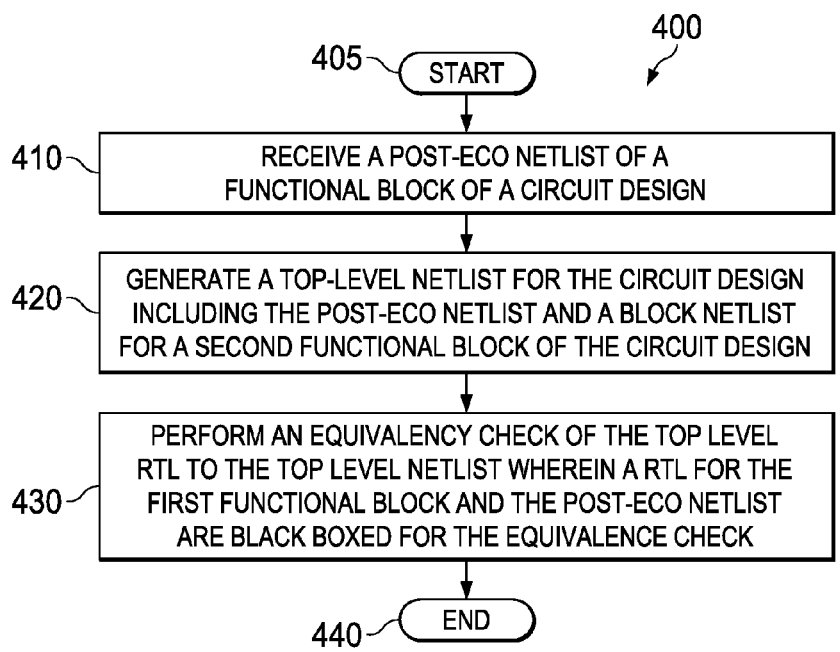
FIG. 4 illustrates a flow diagram of an embodiment of a method of performing equivalence checking of a circuit carried out according to the principles of the disclosure.

FIG. 4 illustrates a flow diagram of an embodiment of a method 400 of performing equivalence checking of a circuit design carried out according to the principles of the disclosure. The circuit design includes multiple functional blocks including at least one proprietary functional block. For the method 400, the circuit design is a co-development between a first party and a second party that are distinct parties. In one embodiment, the first party is a customer of a vendor and the second party is the vendor. The method 400 begins in a step 405.

In a step 410, a post-ECO netlist of a first functional block of the circuit design is received. The first functional block is a proprietary function block and the post-ECO netlist has already been verified employing an equivalence checker. In one embodiment, the post-ECO netlist is verified according to the method illustrated in FIG. 3.

A top level netlist is generated in a step 420 for the circuit design including the post-ECO netlist and a block netlist for a second functional block of the circuit design. Generating the top level RTL for the circuit design includes a RTL for the second functional block. Since the first functional block is proprietary, a post-ECO RTL is not available. However, the first functional block RTL is golden. The top level netlist can be a post-synthesis netlist, a post-DFT netlist or a post-layout netlist of the circuit design. In one embodiment, the top level of the circuit design is a system on chip (SoC) level.

In a step 430, an equivalency check of the top level RTL to the top level netlist is performed wherein a RTL for the first functional block and the post-ECO netlist are black boxed for the equivalence checking. The equivalence check in step 430 includes debugging and additional checking until a successful equivalence check is performed.

The method 400 continues to step 440 and ends by proceeding to tape out of the circuit design after a successful equivalency check.

The above-described apparatuses and methods may be embodied in or performed by various conventional digital data processors or computers, wherein the computers are programmed or store executable programs of sequences of software instructions to perform one or more of the steps of the methods, e.g., steps of the method of FIG. 2, 3 or 4. The software instructions of such programs may represent algorithms and be encoded in machine-executable form on non-transitory digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods, e.g., one or more of the steps of the method of FIG. 2, 3 or 4, or functions of the apparatuses described herein.

Certain embodiments of the invention further relate to computer storage products with a non-transitory computer-readable medium that have program code thereon for performing various computer-implemented operations that embody the tools or carry out the steps of the methods set forth herein. Non-transitory used herein refers to all computer-readable media except for transitory, propagating signals. Examples of non-transitory computer-readable media include, but are not limited to: magnetic media such as hard disks, floppy disks, and magnetic tape; optical media such as CD-ROM disks; magneto-optical media such as floptical disks; and hardware devices that are specially configured to store and execute program code, such as ROM and RAM devices. Examples of program code include both machine code, such as produced by a compiler, and files containing higher level code that may be executed by the computer using an interpreter.

Those skilled in the art to which the invention relates will appreciate that other and further additions, deletions, substitutions and modifications may be made to the described embodiments without departing from the scope of the invention.

What is claimed is:

1. A method of equivalence checking a top level of a circuit design having multiple functional blocks, comprising:
   receiving, by a computer, a post-engineering change order (ECO) netlist of a first one of said functional blocks, wherein said post-ECO netlist has been verified employing an equivalence checker;
   generating a top level netlist for said circuit design including said post-ECO netlist and a block netlist for a second one of said multiple functional blocks;
   generating a top level register transfer level (RTL) for said circuit design including a RTL for said second functional block; and
   performing an equivalency check of said top level RTL to said top level netlist, wherein a RTL for said first functional block and said post-ECO netlist are black boxed for said performing, wherein said black boxed RTL for said first functional block is analyzed as a whole without examining internal circuitry thereof.

2. The method as recited in claim 1 wherein said RTL for said first functional block is unavailable for said performing.

3. The method as recited in claim 1 wherein said first functional block is a proprietary design and said first functional block RTL is not provided for said method.

4. The method as recited in claim 1 wherein said top level netlist is a post-synthesis netlist of said circuit design, a post-DFT netlist of said circuit design or a post-layout netlist of said circuit design.

5. The method as recited in claim 1 wherein said circuit design is a co-development between a first party and a second party that are distinct parties.

6. The method as recited in claim 5 wherein said first party is a customer of a vendor and said second party is said vendor.

7. The method as recited in claim 1 wherein said first functional block RTL is golden.

8. The method as recited in claim 1 wherein said top level of said circuit design is a system on chip (SoC) level.

9. The method as recited in claim 1 further comprising proceeding to tape out of said circuit design when said equivalency testing is successful.

10. A non-transitory computer-readable medium having stored thereon instructions that, when executed, implement a method of performing an equivalency check of a top level of a circuit design, said method comprising:
    receiving a post-engineering change order (ECO) netlist of a first functional block of said circuit design, wherein said post-ECO netlist has been verified employing an equivalence checker; and
    performing an equivalency check of a top level register transfer level (RTL) of said circuit design to a top level netlist of said circuit design, said top level RTL including a RTL of a second functional block of said circuit design and said top level netlist including a netlist of said second functional block, wherein a first functional block RTL and said post-ECO netlist are black boxed for said performing, wherein said black boxed RTL for said first functional block is analyzed as a whole without examining internal circuitry thereof.

11. The computer readable medium as recited in claim 10 wherein said first functional block is a proprietary design and said first functional block RTL is not provided for said method.

12. The computer readable medium as recited in claim 10 wherein said top level netlist is a post-synthesis netlist of said circuit design, a post-DFT netlist of said circuit design or a post-layout netlist of said circuit design.

13. The computer readable medium as recited in claim 10 wherein said circuit design is a co-development between a first party and a second party that are distinct parties, wherein said first party is a customer of said vendor and said second party is a vendor.

14. The computer readable medium as recited in claim 10 wherein said first functional block RTL is golden.

15. The computer readable medium as recited in claim 14 wherein said first functional block RTL is post-ECO.

16. The computer readable medium as recited in claim 10 wherein said top level of said circuit design is a system on chip (SoC) level.

17. An apparatus, comprising:
- circuitry for receiving a post-engineering change order (ECO) netlist of a first functional block of a circuit design, wherein said post-ECO netlist has been verified employing an equivalence checker; and
- circuitry for performing an equivalency check of a top level register transfer level (RTL) of said circuit design to a top level netlist of said circuit design, said top level RTL including a first black box for a RTL of said first functional block and a RTL of a second functional block of said circuit design, said top level netlist including a second black box for said post-ECO netlist and a netlist of said second functional block, wherein said first black box for said RLT of said first functional block is analyzed as a whole without examining internal circuitry thereof.

18. The apparatus as recited in claim 17 wherein said circuit design is a co-development between a first party and a second party that are distinct parties, wherein said first party is a customer of a vendor and said second party is said vendor, wherein said first functional block is a proprietary design of said customer and said first functional block RTL is not provided to said vendor for said method.

19. The apparatus as recited in claim 17 wherein said first functional block RTL is golden and said first functional block RTL is pre-ECO.

20. The apparatus as recited in claim 17 wherein said circuit design is an integrated circuit design and said top level of said circuit design is a system on chip (SoC) level of said integrated circuit.

* * * * *